(12) United States Patent
Cheong et al.

(10) Patent No.: US 6,478,873 B1
(45) Date of Patent: Nov. 12, 2002

(54) METHOD OF OPTIMIZING PROCESS OF SELECTIVE EPITAXIAL GROWTH

(75) Inventors: Woo Seock Cheong; Hai Won Kim, both of Ichon- Shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/722,033

(22) Filed: Nov. 27, 2000

(30) Foreign Application Priority Data

Dec. 30, 1999 (KR) .......................................... 99-65589

(51) Int. Cl.$^7$ ............................................. C30B 25/16
(52) U.S. Cl. ........................ 117/101; 117/89; 117/102; 117/104; 117/935
(58) Field of Search ............................... 117/935, 101, 117/104, 102, 89

(56) References Cited

U.S. PATENT DOCUMENTS

| | | | | |
|---|---|---|---|---|
| 4,522,662 A | * | 6/1985 | Bradburg | 117/84 |
| 4,728,623 A | | 3/1988 | Lu et al. | 437/52 |
| 4,738,937 A | | 4/1988 | Parsons | 437/180 |
| 4,918,029 A | | 4/1990 | Kim | 437/119 |
| 5,004,702 A | | 4/1991 | Samata et al. | 437/57 |
| 5,030,583 A | | 7/1991 | Beetz | 437/39 |
| 5,032,538 A | | 7/1991 | Bozler et al. | 437/83 |
| 5,045,494 A | | 9/1991 | Choi et al. | 437/60 |
| 5,272,109 A | | 12/1993 | Motoda | 437/129 |
| 5,322,802 A | | 6/1994 | Baliga et al. | 437/52 |
| 5,322,814 A | | 6/1994 | Rouse et al. | 437/110 |
| 5,378,652 A | | 1/1995 | Samata et al. | 437/189 |
| 5,432,121 A | | 7/1995 | Chan et al. | 437/95 |
| 5,435,856 A | | 7/1995 | Rouse et al. | 136/225 |
| 5,494,837 A | | 2/1996 | Subramanian et al. | 437/34 |
| 5,508,225 A | | 4/1996 | Kadoiwa | 437/129 |
| 5,567,652 A | | 10/1996 | Nishio | 437/200 |
| 5,599,724 A | | 2/1997 | Yoshida | 437/40 |
| 5,627,102 A | | 5/1997 | Shinriki et al. | 437/192 |
| 5,633,201 A | | 5/1997 | Choi | 438/620 |
| 5,646,425 A | * | 7/1997 | Beach | 257/102 |
| 5,744,377 A | | 4/1998 | Sekiguchi et al. | 438/674 |
| 5,773,350 A | | 6/1998 | Herbert et al. | 438/364 |
| 5,804,470 A | | 9/1998 | Wollesen | 438/141 |

FOREIGN PATENT DOCUMENTS

| | | |
|---|---|---|
| JP | 54-158880 | 12/1979 |
| JP | 60-052016 | * 3/1985 |
| JP | 2-37745 | 2/1990 |
| JP | 2-260667 | 10/1990 |
| JP | 8-236728 | 9/1996 |
| JP | 10-107219 | 4/1998 |
| JP | 11-97519 | 4/1999 |

OTHER PUBLICATIONS

Riedl et al, "Thermodyamic method of Determining Equilibriums and Slight Supersaturations . . . ", Przegl, Elektron, vol. 6(7) Abstract Only, 1965.*

* cited by examiner

Primary Examiner—Robert Kunemund
(74) Attorney, Agent, or Firm—Finnegan, Hendeson, Farabow, Garrett, & Dunner, L.L.P.

(57) ABSTRACT

A method of optimizing a process of selective epitaxial growth sets a guideline for the reaction temperature, pressure, and gas ratio and calculates a non-equilibrium factor ($NEF=[\exp(1-(A/B))\times C-D]\times F\times(1/S)$) depending on the characteristic of the equipment and the types of source gases by controlling a super-saturation ratio depending on a basic thermodynamic law. The selective epitaxial growth by CVD is a deposition method by which a reactive product by thermal activation of a reactive gas is obtained in the shape of a thin film. Therefore, it can successfully form the selective epitaxial growth through control of the super-saturation ratio so that the selective epitaxial growth can be optimized. Also, the method can optimize the process by monitoring the quality of the thin film such as selectivity securing control of deposition speed, facet, reduction in deflects, etch depending on the pattern material. In addition, it can find out a relative process limit of the apparatus using the NEF to maximize development of the selective epitaxial growth apparatus.

5 Claims, 3 Drawing Sheets

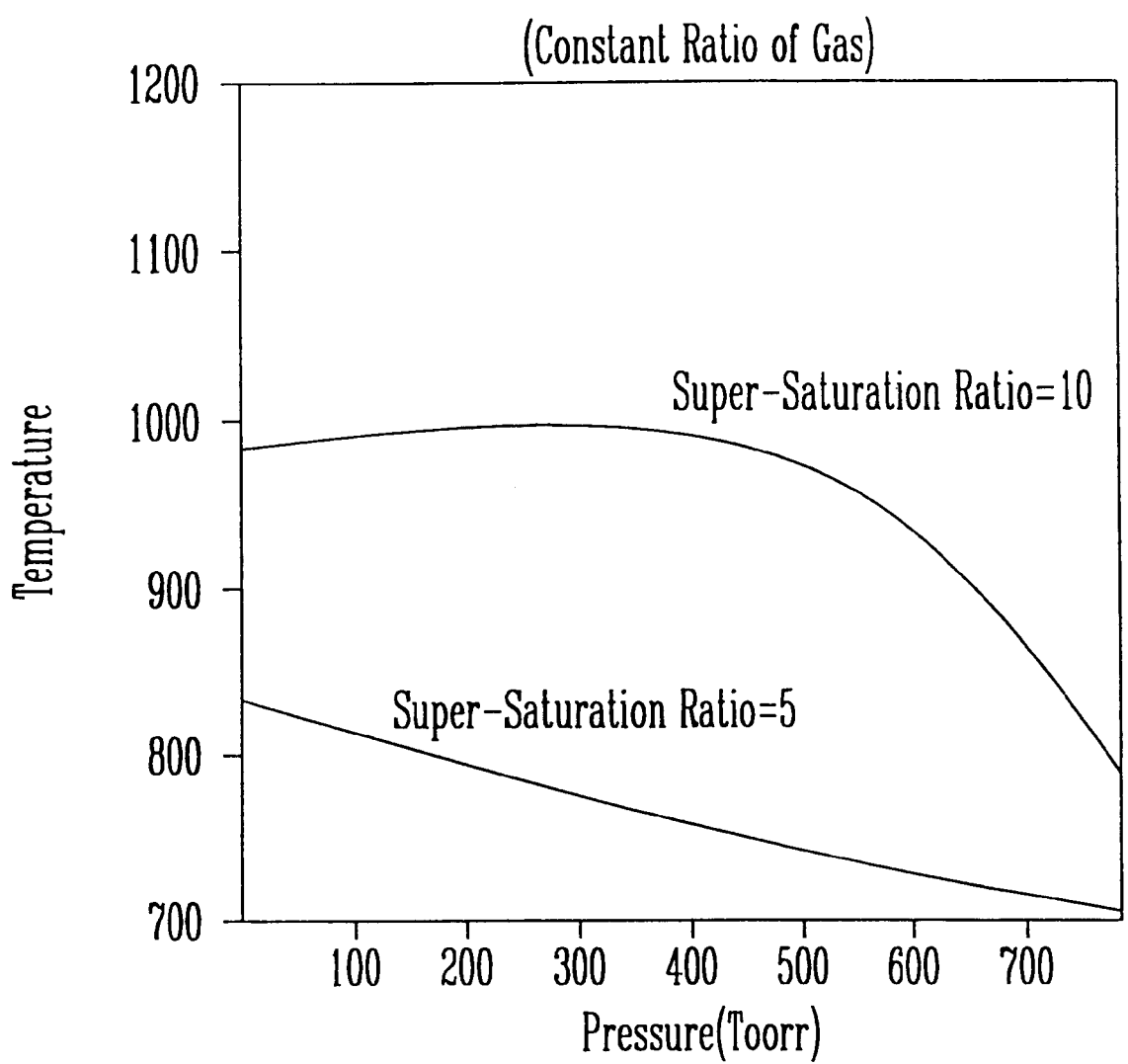

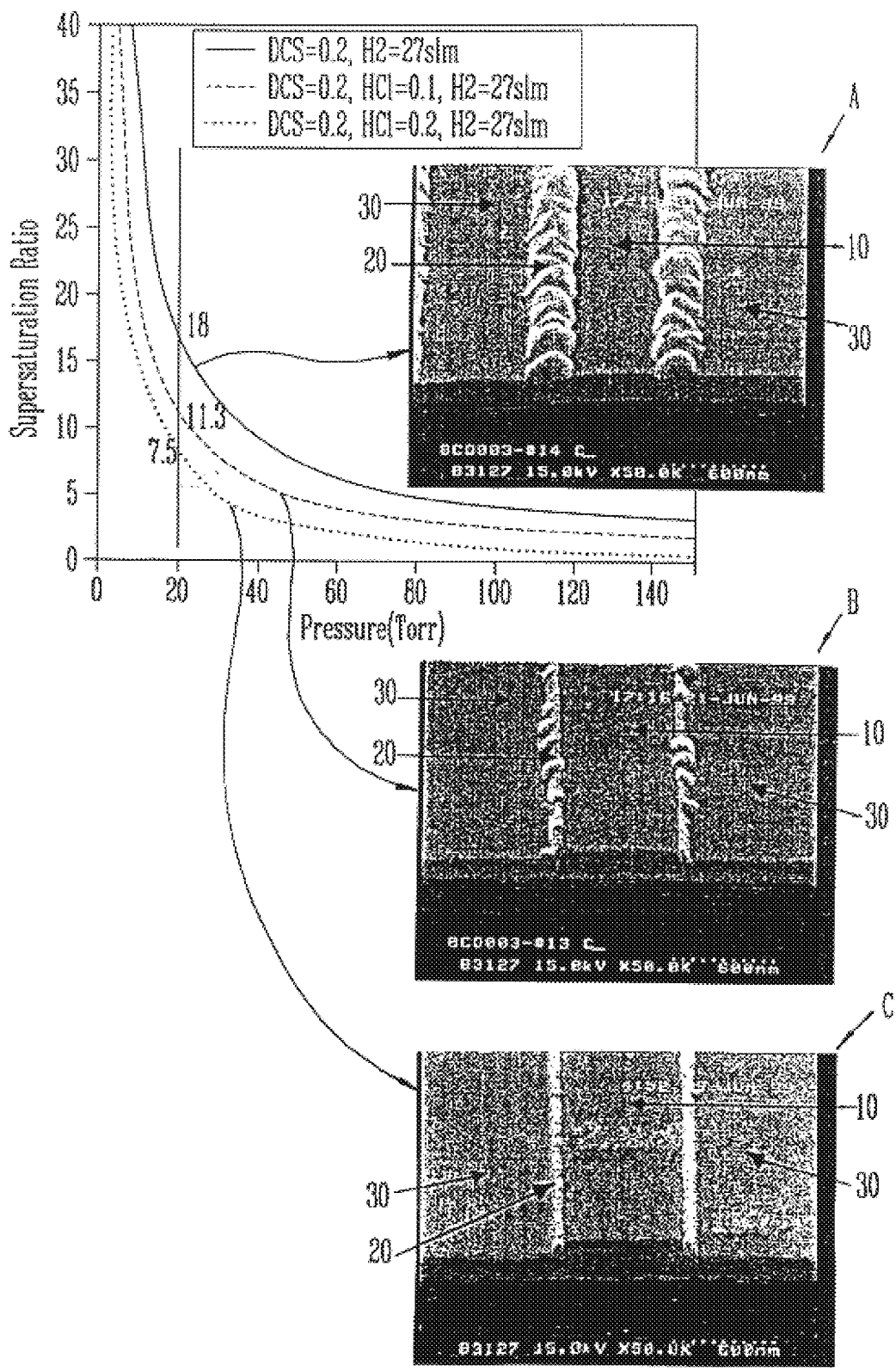

METHOD OF OPTIMIZING PROCESS OF SELECTIVE EPITAXIAL GROWTH

BACKGROUND OF THE INVENTION

1. Field of the Invention

The invention relates generally to a method of optimizing the process of selective epitaxial growth. More particularly, the present invention relates to a method of optimizing the process of selective epitaxial growth, by setting a guideline for the reaction temperature, pressure, and gas ratio. A non-equilibrium factor dependent on the characteristic of the equipment and the types of source gases is then calculated using a super-saturation ratio dependent on basic thermodynamics law, since the selective epitaxial growth by CVD is a deposition method by which a product created by thermal activation of reactive gases is obtained in the shape of a thin film.

2. Description of the Related Art

In manufacturing processes of semiconductor devices, application of selective epitaxial growth technology is highly valued in view of the reduction in cell size and simplification of the process. In selective epitaxial growth by CVD, it is difficult to obtain a desired thin film shape without a comprehensive understanding of complicated technology; however, it is required that its mechanism be analyzed exactly.

As a CVD reaction is fundamentally based on a thermal chemical reaction, it depends on thermal chemical law. In particular, where a selective epitaxial growth (SEG) layer is grown by a low pressure/rapid thermal processing-chemical vapor deposition (LP/RTP-CVD) method using a Si—CL—H gas system, its applicability is increased. This is because application of the Si—Cl—H gas system occurs in a high temperature process and its pressure is much higher than the selective epitaxial growth process by UHV-CVD, since it approaches to a thermodynamics reaction atmosphere in case of high temperature and pressure.

SEG by a general LP/RPT-CVD method uses a Si—Cl—H gas system. So far, many experiments have been made to find out its process limits in order to grasp respective parameters related to the selective epitaxial growth, that is, dependency of temperature, pressure, and gas ratio so that the process conditions can be optimized.

Also, whenever the gas system is changed or the type of the equipment is varied, it is difficult to exactly find out the margin of the selective epitaxial growth process for the equipment. It is also difficult to find out the characteristics of the source gas.

In addition, there is no basic reference for securing selectivity for the pattern material and controlling facets and defects.

As such, since there is no guideline relating to the selective epitaxial growth process, there is a problem in that optimized points must be determined through experimentation.

SUMMARY OF THE INVENTION

The present invention provides a method of optimizing the process of selective epitaxial growth, by setting a guideline for the reaction temperature, pressure, and gas ratio and then calculating a non-equilibrium factor dependent on the characteristics of the equipment and the types of source gases, using a super-saturation ratio dependent on basic thermodynamics law, since the selective epitaxial growth by CVD is a deposition method by which a reactive product by thermal activation of a reactive gas is obtained in the shape of a thin film.

A method of optimizing the process of selective epitaxial growth according to the present invention comprises setting a guideline of the selective epitaxial growth process to the value of a super-saturation ratio for the variations in temperature, pressure, and gas ratio when the selective epitaxial growth process is performed in a LP/RPT-CVD apparatus.

Also, a non-equilibrium factor (NEF) affecting the selective epitaxial growth when the selective epitaxial growth process is performed in a LP/RPT-CVD apparatus is as follows:

$$NEF = [exp(l-(A/B)) \times C - D] \times F \times (1/S)$$

wherein A: actual temperature of a wafer.
B: the set temperature of the wafer.
C: relative weight relating to the type of the equipment (ranging between 1~5).
D: relative items relating to the gas mixing and the type of gas.
F: factor relating to the pressure and formation of a diffusion layer (the value increases as the pressure increases).
S: total area of the window/total area of the wafer The present invention determines a guideline for the process, including a super-saturation curve in a situation where the temperature, pressure, and gas ratio are varied in a selective epitaxial growth process. Thus, it can optimize the growth condition by setting the range where desired epitaxial growth can occur. It also optimizes the selective epitaxial growth condition depending on respective parameters by calculating the non-equilibrium factor to determine a relative difference of the respective parameters affecting the process.

BRIEF DESCRIPTION OF THE DRAWINGS

The aforementioned aspects and other features of the present invention will be explained in the following description, taken in conjunction with the accompanying drawings, wherein:

FIG. 3 is a graph showing a super-saturation ratio curve depending on variations in temperature and pressure at a constant gas ratio; and FIG. 4 is a diagram showing selectivity depending on a pattern material depending on variations in a super-saturation ratio.

DETAILED DESCRIPTION OF PREFERRED EMBODIMENTS

Figure 1:
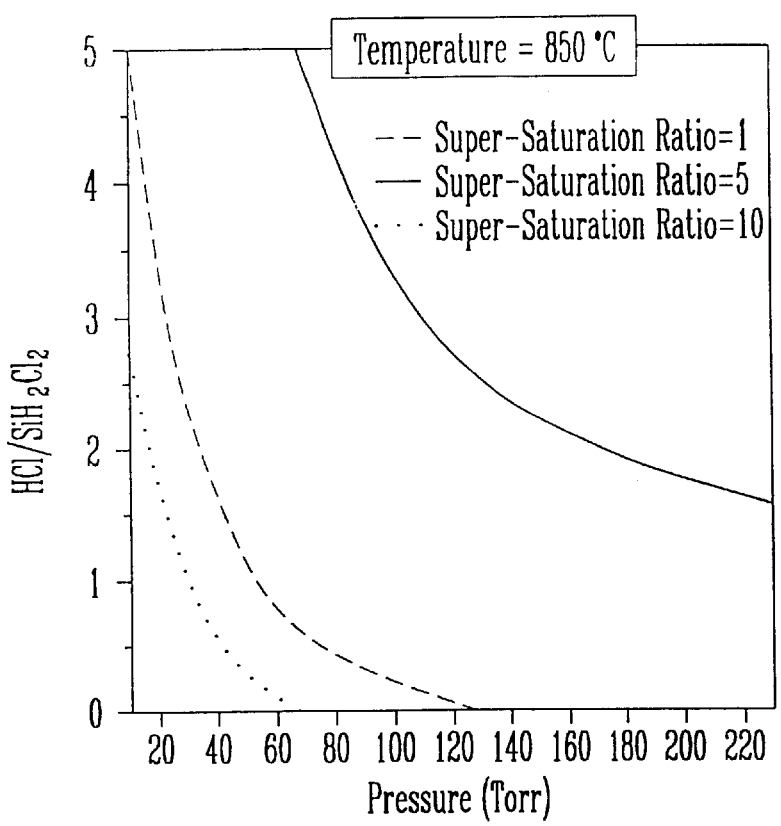
FIG. 1 is a graph showing a super-saturation ratio curve depending on variations in the ratio of gas and in the pressure at a constant temperature.

The present invention will be described in detail by way of a preferred embodiment with reference to accompanying drawings, in which like reference numerals are used to identify the same or similar parts.

The present invention is based on a study into the possibility of thermodynamically-based calculation of a CVD reaction and an apparatus for performing selective epitaxial growth. CVD fundamentally follows thermodynamics law since it is a deposition method by which a reactive product in the shape of a thin film is obtained by thermal activation of reactive gases.

Particularly, an LP/RTP-CVD apparatus capable of performing selective epitaxial growth employs a $SiCl_xH_{4-x}$—HCl—$H_2$ gas, the pressure and process temperature of which are generally set higher than in UHV-CVD apparatus using $Si_2H_6$, thus allowing a thermodynamic analysis. In this case, it allows silicon to be grown on a silicon substrate in a small range having a small deposition driving force, using the difference in a physical characteristic of a substrate, that is, the surface characteristics of a silicon substrate and an insulating material and an electrical characteristic relating to charge transfer. If the deposition driving force becomes greater than a limit value, silicon is grown even on the insulating material. At this time, the limit value nucleus—generated is varied depending on the pattern material.

Here, the deposition driving force of the CVD thin film can be expressed as the difference ($\Delta\mu$) of the chemical potential in the solid and gaseous phases of the deposition material, rather than variation in the total driving force for the CVD reaction.

$$\Delta\mu = -RT\ln(P^*_{si})/(P^0_{si})$$

$P^*_{si}$ indicates a partial pressure of silicon vapor and $P^0_{si}$ indicates an equilibrium vapor pressure of silicon at a deposition temperature. Also, it can be seen that the deposition driving force, $P^*_{si}/P^0_{si}$ used as a parameter, is a supersaturation ratio, which corresponds to the value of the super-saturation ratio.

At this time, the basic thermodynamic data can be found from various databases such as JANAF. The partial pressure in a gas equilibrium state can be obtained when the free energy of the entire system is minimal. That is, the value of the super-saturation ratio can be obtained using the free energy minimization scheme.

Meanwhile, selective epitaxial growth is a process by which the difference in the physical characteristic of a substrate material and the super-saturation ratio upon deposition of silicon are adequately controlled. That is, if the gaseous phase has a super-saturation ratio surpassing the difference in the physical characteristic of a substrate material, selective epitaxial growth will not occur.

Therefore, the present invention uses various graphs to determine the margin of the selective epitaxial growth process and compares the results of thermodynamic analysis when the selective epitaxial growth is performed in an LP/TRP-CVD apparatus. Also, it ascertains the system characteristics and the apparatus characteristics using nonequilibrium factors to optimize the selective epitaxial growth process.

FIG. 1 is a graph showing a super-saturation ratio curve depending on variations in the gas ratio and pressure at a constant temperature, which shows the calculated result of equal super-saturation curve when the gas ratio (HCl/DCS) is in a range of between 0~5 at a temperature of about 850° C. and the pressure is in a range of between 10~225 Torr, for a DCS (dichlorosilane, $SiCl_2H_2$)—HCl—$H_2$ gas system basis.

It can be seen that an increase in pressure and gas ratio represents an inversely proportional relationship in the equal-equilibrium curve. If the super-saturation ratio is below 1 (one), it means that the substrate is etched. Thus, it can be seen that a stable selective epitaxial growth is obtained in a range of between 1~10.

Growth speed is increased as the super-saturation ratio increases even when selective epitaxial growth occurs. Meanwhile, if its selectivity needs to increase depending on the pattern material, the process condition must be set so as to lower the super-saturation ratio. This shape of the graph can be applied to the $SiCl_xH_{4-x}$—HCl—$H_2$ gas system and the temperature can be variously set in a range of between 700~1200° C.

Therefore, to improve the selectivity or control growth speed depending on the pattern material, the super-saturation ratio is controlled to optimize the process.

Figure 2:
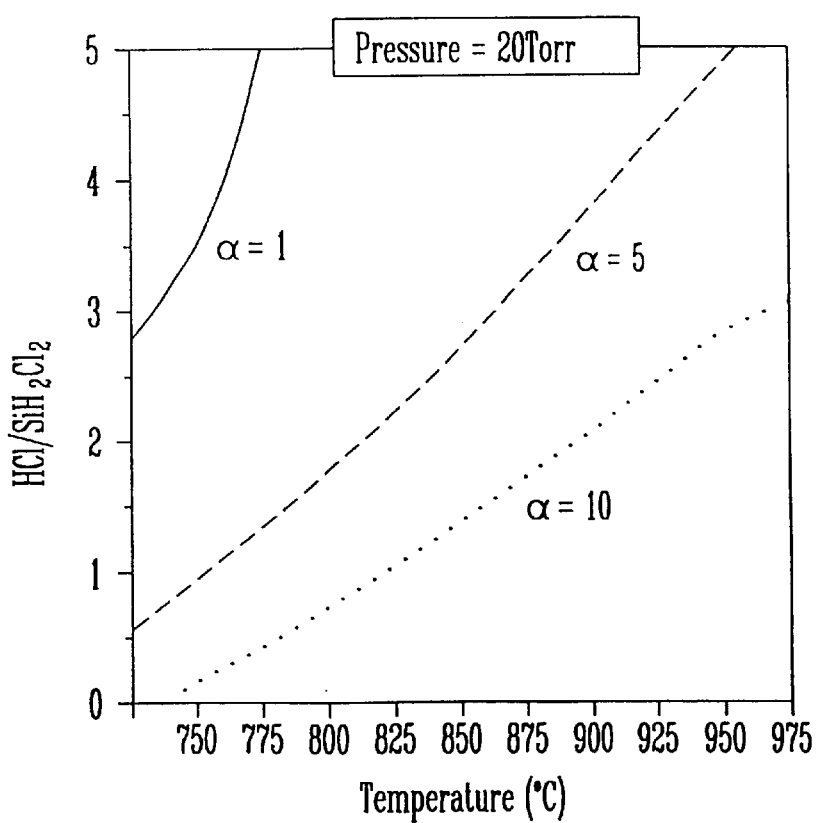
FIG. 2 is a graph showing a super-saturation ratio curve depending on variations in the ratio of gas and temperature at a constant pressure.

FIG. 2 is a graph showing a super-saturation ratio curve depending on variations in the gas ratio and temperature at a constant pressure, which shows the calculated result of an equal super-saturation curve when the gas ratio (HCl/DCS) is in a range of between 0~5 and the temperature is in a range of between 525~975° C. at 20 Torr, for a DCS (dichlorosilane, $SiCl_2H_2$)—HCl—$H_2$ gas system basis.

From the graph, it can be seen that an increase in the temperature means an increase in the super-saturation ratio at a constant gas ratio. If the super-saturation ratio is below 1 (one), it means that the substrate is etched. Thus, it can be seen that a stable selective epitaxial growth is obtained in the range of between 1~10.

Growth speed is increased as the temperature is raised, even at the same super-saturation ratio. This is because other parameters related to the reactive speed are involved. This shape of the graph can be applied to a $SiCl_xH_{4-x}$—HCl—$H_2$ gas system and the pressure can be variously set in a range of between 1~760 Torr.

Therefore, the super-saturation ratio is controlled to optimize the selective epitaxial growth process.

FIG. 3 is a graph showing a super-saturation ratio curve depending on variations in the temperature and pressure at a constant ratio of gas.

As shown, the super-saturation ratio is drawn in which the range pressure and the temperature is variously set in the case where the gas ratio is constant. Thus, the selective epitaxial growth process can be optimized using a guideline applied to the $SiCl_xH_{4-x}$—HCl—$H_2$ gas system.

In the above case, the super-saturation region in which a stable selective epitaxial growth is possible varies in the range of about 1~10 on a thermal oxide film basis, as its selectivity is varied depending on the gas system and the pattern material, the value may be increased or decreased.

FIG. 4 is a diagram showing selectivity depending on a pattern material dependent on variations in the super-saturation ratio.

As can be seen from the graph, the pattern material shows variation in its selectivity for the nitride film as the super-saturation ratio changes from 18→11.3→7.5 at a temperature of 800° C. and a pressure of 20 Torr.

In the FIG. 4, a first photograph A represents a sample for a super-saturation ratio of 18, a second photograph B represents a sample for a super-saturation ratio of 11.3, and a third photograph C represents a sample for a super-saturation ratio of 7.5. In order to grow the epitaxial layer 30 by securing selectivity of the nitride film which is a spacer 20 formed at the sidewall of the oxide film 10, the super-saturation ratio is used to optimize the process.

As in the above, not only is the super-saturation ratio controlled to stably form the selective epitaxial growth, but also, quality problems of the thin film such as selectivity securing, control of deposition speed, facet, and reduction in defects are controlled to optimize the process.

In an LP/RTP-CVD apparatus, when the selective epitaxial growth is applied, it is compared with the results of a thermodynamic analysis to ascertain the system characteristics and the apparatus characteristics using non-equilibrium factors. Thus, the process may be optimized by finding out the relationship of the non-equilibrium factors and selective epitaxial growth process.

The non-equilibrium factor (NEF) can be represented as the difference between the range of the selective epitaxial growth process as a result of a thermodynamic calculation and the range of the selective epitaxial growth process when the apparatus is actually used.

In order to discriminate factors that may affect the NEF, it is advantageous to define the atmospheric conditions that are considered to be thermodynamically ideal.

First, the reactive gases will rapidly react to create a gas equilibrium state during the gaseous phase. Second, the deposition particles must be rapidly moved to the surface of the substrate without creating a nucleus during the gaseous phase.

However, these atmospheric conditions may be different from an actual situation.

Therefore, first, a window area ratio (the window area/the total wafer area) by the pattern material is a parameter of the NEF. This is the value related to the micro-loading effect, which requires a higher super-saturation ratio in the selective epitaxial growth process as its area becomes greater. Second, exactness of the gas system, the heating system, the gas flow, and MFC (mass flow controller) concerning the apparatus problems can be considered. Finally, how do the temperature, at which the selective epitaxial growth process is made, and the set temperature differ?

Through the above parameters, an experimental equation for obtaining the NEF can be expressed as follows:

$$NEF=[exp(l-(A/B))\times C-D]\times F\times(1/S)$$

where A: actual temperature of a wafer

B: the set temperature of the wafer

C: relative weight relating to the type of the equipment ranges between (1~5)

D: relative items relating to the gas mixing and the type of gas

F: factor relating to the pressure and formation of a diffusion layer (the value increases as the pressure increases)

S: =total area of the window/total area of the wafer

At this time, B, F and S are predetermined values, A must be exactly measured and C is a specific gravity, being the value to evaluate the state of the apparatus along with D.

As above, the condition calculated by thermodynamic analysis and the condition in the actual process are compared to calculate the value of NEF. Thus, the relative comparative value for the type of apparatus and the type of gas is discovered to optimize the process so that stable selective epitaxial growth can occur.

As mentioned above, the present invention can obtain optimization of the selective epitaxial growth process regardless of the selective epitaxial growth apparatus, by calculating the super-saturation ratio of silicon for the pressure, temperature, and gas ratio in the selective epitaxial growth process by the LP/TRP-CVD process that can be applied to the thermodynamic analysis and then to set the margin of the selective epitaxial growth process.

Also, through control of the super-saturation ratio, not only the selective epitaxial growth can be successfully formed but also the thin film quality factors such as selectivity securing, control of deposition speed, facet, reduction in defects, and etch depending on the pattern material can be monitored to optimize the process.

Meanwhile, as a relative process limit for the apparatus can be found out by the NEF, development of the selective epitaxial growth apparatus can be maximized.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of optimizing a selective epitaxial growth process, comprising:

controlling at least three factors of a temperature, a pressure and a gas ratio;

obtaining a graph including an equal-supersaturation ratio curve by varying two factors of the three factors and holding one factor of the three factors constant;

setting a guideline of the selective epitaxial growth process by selecting the two variable factors in a super-saturation ratio range of 1 to 10 by referring to the graph when the selective epitaxial growth process is performed in a low pressure/rapid thermal processing-chemical vapor deposition (LP/RPT-CVD) apparatus.

2. The method of optimizing a selective epitaxial growth process according to claim 1, wherein the selective epitaxial growth process consists of a system including a silicon source gas of $SiCl_xH_{4-x}$ and a HCl and $H_2$ gas.

3. The method of optimizing a selective epitaxial growth process according to claim 1, wherein a super-saturation ratio is a value obtained by dividing a partial pressure of a silicon vapor at a gaseous equilibrium state of a gas phase by an equilibrium vapor pressure of silicon.

4. The method of optimizing a selective epitaxial growth process i according to claim 1, wherein said gas ratio is a value obtained by dividing HCl by $SiCl_xH_{4-x}$.

5. A method of optimizing a selective epitaxial growth process being characterized in that a non-equilibrium factor (NEF) affecting the selective epitaxial growth when the selective epitaxial growth process is performed in a LP/RPT-CVD apparatus is as follows:

$$NEF=[exp(l-(A/B))\times C-D]\times F\times(1/S)$$

wherein A: actual temperature of a wafer)

B: the set temperature of the wafer;

C: relative weight relating to the type of the equipment ranges between (1 to 5), D: relative items relating to the gas mixing and the type of gas, F: factor relating to pressure and formation of a diffusion layer (its value increases as the pressure increases), S: total area of a window/total area of the wafer.

* * * * *

UNITED STATES PATENT AND TRADEMARK OFFICE
CERTIFICATE OF CORRECTION

PATENT NO.    : 6,478,873 B1
DATED         : November 12, 2002
INVENTOR(S)   : Barak It is certified that error appears in the above-identified patent and that said Letters Patent is hereby corrected as shown below:

<u>Title page,</u>
Item [73], Assignee, should read as follows:

-- [73]  Assignee: Bromine Compounds Limited, Beer-Sheva (IL) --.

Signed and Sealed this

Seventeenth Day of June, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,478,873 B1
DATED : November 12, 2002
INVENTOR(S) : Woo Seock Cheong et al.

It is certified that error appears in the above-identified patent and that said Letters Patent is hereby corrected as shown below:

This certificate supersedes Certificate of Correction issued June 17, 2003, the number was erroneously mentioned and should be vacated since no Certificate of Correction was granted.

Signed and Sealed this

Thirtieth Day of September, 2003

JAMES E. ROGAN
*Director of the United States Patent and Trademark Office*